United States Patent [19]

Ozaki

[11] Patent Number: 5,337,321
[45] Date of Patent: Aug. 9, 1994

[54] SCAN PATH CIRCUIT WITH CLOCK SIGNAL FEEDBACK, FOR SKEW AVOIDANCE

[75] Inventor: Hideharu Ozaki, Tokyo, Japan

[73] Assignee: NEC Corporation, Tokyo, Japan

[21] Appl. No.: 773,071

[22] Filed: Oct. 8, 1991

[30] Foreign Application Priority Data

Oct. 8, 1990 [JP] Japan .................. 2-270051

[51] Int. Cl.⁵ .......................................... H04B 17/00
[52] U.S. Cl. .................................................. 371/22.3
[58] Field of Search ........................... 371/22.2, 23.2, 1

[56] References Cited

U.S. PATENT DOCUMENTS 4,942,577  7/1990  Ozaki ..................... 371/22.3
5,062,110  10/1991  Kobayashi et al. ........... 371/22.3

OTHER PUBLICATIONS

Joy et al., "Clock Period Minimization with Wave Pipelining", Apr. 1994, IEEE vol. 12, No. 4, pp. 461–470.

Primary Examiner—Robert W. Beausoliel, Jr.
Assistant Examiner—Norman M. Wright
Attorney, Agent, or Firm—Ostrolenk, Faber, Gerb & Soffen

[57] ABSTRACT

The scan path circuit includes N number of flip-flops connected in cascade to form a shift register. A first selector and a second selector are connected to each flip-flop to supply the data signal and the clock signal, respectively, to the flip-flop. The first selectors switch the individual data in the normal operation to the scan path test signal and the Q output signals during the test. During the test, the Nth second selector switches the clock signal in the normal operation to the scan path test signal and the second selectors up to the (N−1)th selector switch the clock signals in the normal operation to the clock signals from the output terminals of the next selectors. Thus, clock signals applied to the flip-flops are delayed with respect to those applied to the succeeding flip-flops by a time delay caused by the second selectors, so that the shift register operates reliably irrespective of any clock skew.

3 Claims, 3 Drawing Sheets

SCAN PATH CIRCUIT WITH CLOCK SIGNAL FEEDBACK, FOR SKEW AVOIDANCE

BACKGROUND OF THE INVENTION

1. Field of the Invention

The present invention relates to the art of testing a semiconductor integrated logic circuit and, more particularly, to a scan path circuit for use in a function test of a sequential circuit.

2. Description of the Related Art

As constant efforts are made to achieve higher integration of semiconductor integrated logic circuits, more difficulty is experienced in testing the functions of these circuits. Generally, integrated logic circuits are sequential circuits and, one known method employed to facilitate the test of such a sequential circuit, is the Scan Path method in which the sequential circuit to be tested is first divided into storage elements such as flip-flops and latches, and a combinational circuit to form a scan path circuit. The storage elements are then rearranged to operate as a shift register with the combinational circuit.

FIG. 1 of the accompanying drawings shows a conventional scan path circuit. Data input signals and clocks signals to be supplied to flip-flops 1 through 4 are selected respectively by first selectors 5 through 8 and second selectors 9 through 12. More specifically, during normal operation, signals from a combinational circuit 13 are supplied as data input signals and clock signals to the flip-flops 1 through 4. In the scan path test, a scan switching signal 14 is applied to the first selectors 5 through 8 to switch from the signals from the combinational circuit 13 to a signal from the scan-in terminal 15 and signals from Q output terminals of the preceding flip-flops. At the same time, a clock switching signal 17 is applied to the second selectors 9 through 12 to supply a common clock signal 16 to the flip-flops 1 through 4, which now operate as a shift register.

A test pattern signal is applied from the scanning terminal 15, and the clock signal 16 is applied to establish values stored in the flip-flops 1 through 4. The values stored in the flip-flops 1 through 4 are successively output from a scan-out terminal 18. The output values from the scan-out terminal 18 are compared with a pattern of expected values. In this manner, the sequential circuit is tested.

In the conventional scan path circuit, the clock signal may be applied to the flip-flops at different times because of the uneven layout of clock signal lines for each flip-flop of the shift register, buffers inserted to compensate for the insufficient driving capability of the clock signal, and so on. Thus, in the scan path test, the flip-flops read the data input signals at different times, resulting in the failure to operate properly as a shift register. It has been quite difficult to design clock signal timing for the purpose of avoiding the above problems.

SUMMARY OF THE INVENTION

In view of the aforesaid problems of the conventional scan path circuit, it is an object of the present invention to provide a scan path circuit which allows easy designing of clock signal timing and per, nits reliable shift register operation in a scan path test.

According to the present invention, there is provided a scan path circuit for use in a function test of a semiconductor integrated logic circuit which is composed of N number of flip-flops connected in cascade to form a shift register, N number of first selectors corresponding to the N number of flip-flops, respectively, for supplying individual data signals to the data input terminals of the flip-flops during normal operation, and for supplying a scan path test signal to the data input terminal of the leading flip-flop of the flip-flops and output signals from the preceding flip-flops to the data input terminals of the next flip-flops during the scan path test, and N number of second selectors having output terminals connected to the clock terminals of the flip-flops, a first group of input terminals for supplying clock signals through the output terminals thereof to the clock terminals of the flip-flops during normal operation, and a second group of input terminals for supplying clock signals through the output terminals thereof to the clock terminals of the flip-flops during the scan path test. The input terminals of the second group up to the $(N-1)$th second selector are connected to the output terminals of the succeeding second selectors, and the input terminal of the second group of the Nth second selector is supplied with a clock signal for the scan path test.

In the scan path test, N number of flip-flops of the semiconductor integrated logic circuit is operated as a shift register by the first selectors, with the data input terminal of the leading flip-flop being supplied with a scan path test signal. Each of the second selectors is supplied with a clock signal which is delayed by the delay time caused by the succeeding second selector, and transmits the supplied clock signal to the corresponding flip-flop. Thus, each of the flip-flops reads the output signal from the preceding flip-flop before the clock signal is applied to the preceding flip-flop. The flip-flops successively shift their data until the final flip-flop produces a scan-out signal which is then compared with a pattern of expected values for test results.

With the above circuit arrangement of the invention, the designer of the scan path circuit does not have to take a clock skew, if any, into account, and can easily design clock signal timing for the scan path circuit. The scan path circuit thus designed operates reliably.

The delay times caused by the second selectors are generally equal. However, at least two of the second selectors may have different time delays. Therefore, a wide variety of selectors are available for use in the scan path circuit.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENT

Figure 1:
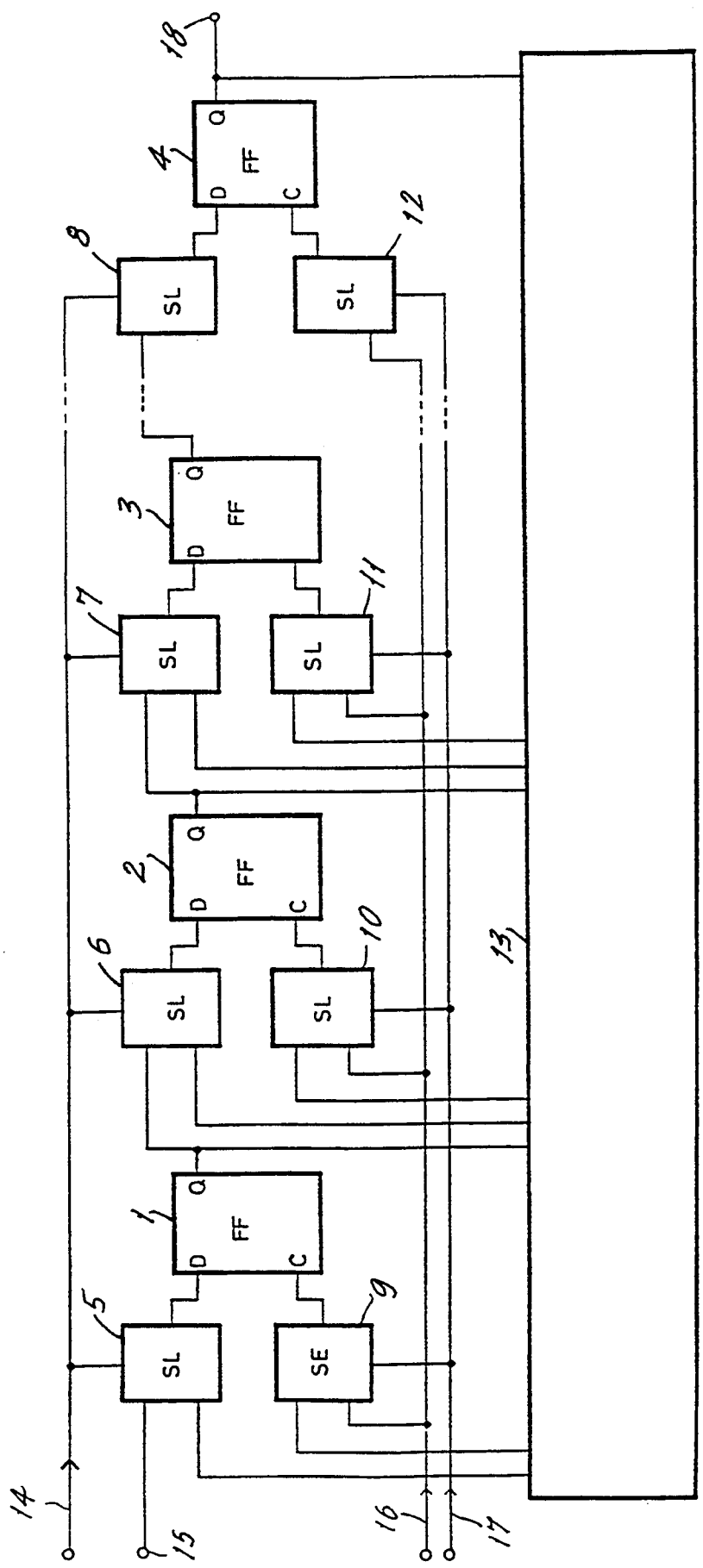
FIG. 1 is a block diagram of a conventional scan path circuit.
Figure 2:
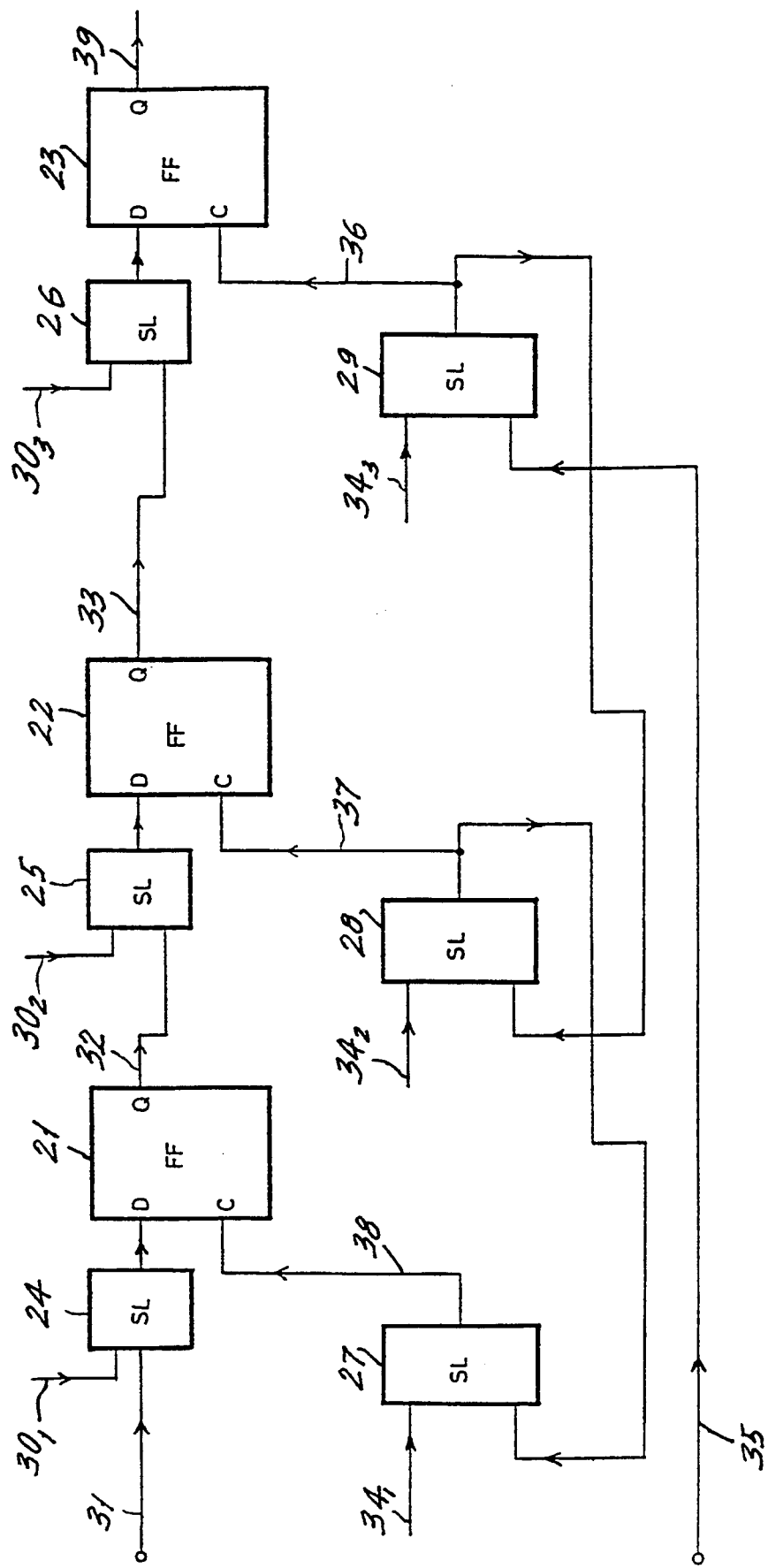
FIG. 2 is a block diagram of the preferred embodiment of the invention scan path circuit.

As shown in FIG. 2, a scan path circuit according to the present invention includes three flip-flops 21, 22, 23 having respective data input terminals D that are connected to the respective output terminals of first selectors 24, 25, 26, and clock terminals C that are connected to the respective output terminals of second selectors 27, 28, 29. The first selectors 24, 25, 26 have input terminals supplied with individual data signals $30_1$, $30_2$, $30_3$, respectively, from a combinational circuit (not shown) during normal operation. The first selector 24 has another input terminal supplied with a scan path test signal 31, and the first selectors 25, 26 have other input terminals supplied with respective Q output signals 32, 33 from the preceding flip-flops 21, 22. The first selectors 24, 25, 26 select the data signals $30_1$, $30_2$, $30_3$ or the scan path test signal 31 and the Q output signals 32, 33 in response to a scan switching signal (not shown) applied thereto, as with the conventional scan path circuit shown in FIG. 1.

The second selectors 27, 28, 29 have input terminals supplied with individual clock signals $34_1$, $34_2$, $34_3$, respectively, during normal operation. The second selector 29 has another input terminal supplied with a clock signal 35 during a scan path test, and the second selectors 27, 28 have other input terminals supplied with respective clock signals from the succeeding selectors 28, 29. The second selectors 27, 28, 29 select the clock signals $34_1$, $34_2$, $34_3$ or the clock signal 35 and the clock signals from the succeeding second selectors in response to a clock switching signal (not shown) applied thereto, as with the conventional scan path circuit shown in FIG. 1.

Operation of the scan path circuit shown in FIG. 2 will be described below with reference to the timing chart of FIG. 3.

During normal operation, the first selectors 24, 25, 26 and the second selectors 27, 28, 29 select the input signals $30_1$, $30_2$, $30_3$ and the clock signals $34_1$, $34_2$, $34_3$ from the combinational circuit so that the flip-flops 21, 22, 23 may operate individually.

In a scan path test, the scan switching signal switches the first selectors 24, 25, 26 from the individual data $30_1$, $30_2$, $30_3$ to the scan path test signal 31 and Q output signals 32, 33, respectively. The clock switching signal switches the second selectors 27, 28 from the clock signals $34_1$, $34_2$ to the clock signals from the succeeding second selectors 28, 29 and also switches the second selector 29 from the clock signal $34_3$, to the clock signal 35. At this time, the flip-flops 21, 22, 23 operate as a shift register. The clock signal 35 supplied to the second selector 29 serves as a clock signal 36 applied to the clock terminal C of the flip-flop 23. The Q output signal from the flip-flop 23 is applied as a scan-out signal 39 to a comparator (not shown), by which it is compared with a pattern of expected values for producing test results. The output signal from the second selector 29 is also supplied through the second selector 28 as a clock signal 37 to the clock terminal of the flip-flop 22.

Figure 3:
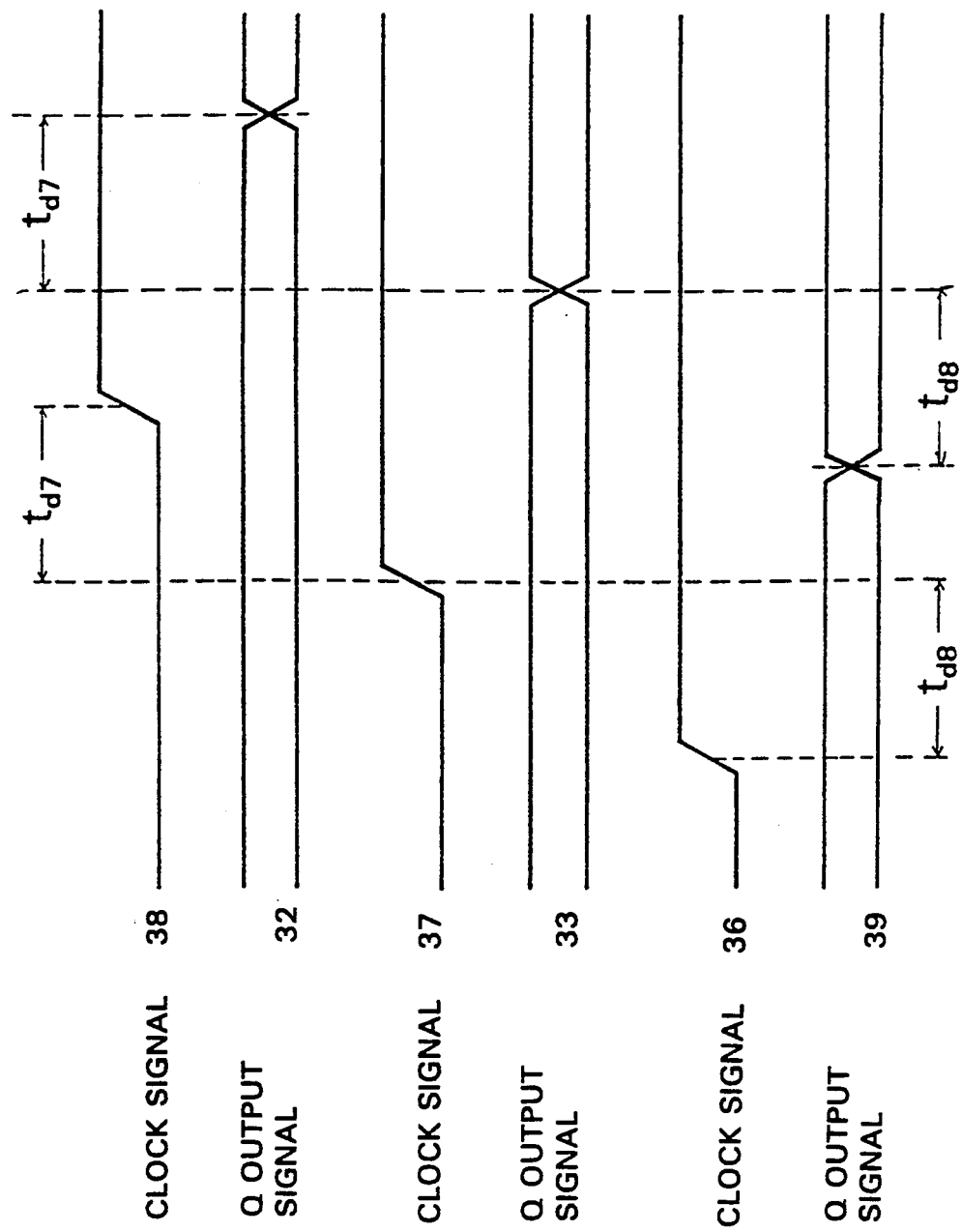
FIG. 3 is a timing chart of clock signals and Q output signals in the scan path circuit shown in FIG. 2.

As shown in FIG. 3, the operating time of the flip-flop 22 always lags behind the operating time of the flip-flop 23 by a time delay $t_{d8}$ corresponding to the time delay in the second selector 28. The value that is read by the flip-flop 23 is the Q output signal 33 produced by the flip-flop 22 before the clock signal 37 is applied to the flip-flop 22.

Likewise, the clock terminal of the flip-flop 21 is supplied with the output signal from the second selector 28 through the second selector 27 as a clock signal 38 that is delayed by a time delay $t_{d7}$ corresponding to the time delay in the second selector 27. In response to the applied clock signal 38, the Q output signal 32 is produced by the flip-flop 21.

With the above embodiment, since clock signals are not required to be simultaneously applied to the flop-flips, the designer of the scan path circuit does not have to take a clock skew, if any, into account, and can easily design the clock signal timing for the scan path circuit. The scan path circuit thus designed operates reliably.

The delay times caused by the second selectors 27, 28, 29 are generally equal but may be different. For example, at least two second selectors may have different time delays.

The shift register in the scan path test has been shown and described as being composed of three flip-flops for the sake of brevity, but may be composed of N number of flip-flops.

Although a certain preferred embodiment of the present invention has been shown and described in detail, it should be understood that various changes and modifications may be made therein without departing from the scope of the appended claims.

What is claimed is:

1. A scan path circuit for use in a function test of a semiconductor integrated logic circuit, the scan path circuit comprising:

N number of flip-flops connected in cascade to form a shift register, each of said flip-flops having a data input terminal and a clock terminal;

N number of selectors provided correspondingly to said N number of flip-flops each having an output terminal connected to the clock terminal of an associated one of said flip-flops, a first input terminal for transferring a clock signal supplied thereto to the clock terminal of said associated one of said flip-flops through the output terminal thereof during a normal operation, and a second input terminal for transferring a clock signal supplied thereto to the clock terminal of said associated one of said flip flops through the output terminal thereof during a scan path test, the second input terminals of the first to (N−1)th ones of said selectors being connected respectively to the output terminals of the second to Nth ones of said selectors, and the second terminal of said Nth one of said selectors being supplied with a clock signal for the scan path test.

2. A scan path circuit according to claim 1, wherein said N number of second selectors have an equal time delay by which the clock signals are delayed when the clock signals are transmitted between the input and output terminals thereof.

3. A scan path circuit according to claim 1, wherein at least two of said second selectors have different time delays by which the clock signals are delayed when the clock signals are transmitted between the input and output terminals thereof.

* * * * *